(12) United States Patent
Hirata

(10) Patent No.: US 10,303,371 B2
(45) Date of Patent: May 28, 2019

(54) DATA STORAGE DEVICE THAT STABILIZES WRITE LATENCY

(71) Applicant: TOSHIBA MEMORY CORPORATION, Tokyo (JP)

(72) Inventor: Takamasa Hirata, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 212 days.

(21) Appl. No.: 15/362,550

(22) Filed: Nov. 28, 2016

(65) Prior Publication Data
US 2017/0160953 A1 Jun. 8, 2017

Related U.S. Application Data

(60) Provisional application No. 62/262,093, filed on Dec. 2, 2015.

(51) Int. Cl.
*G06F 3/06* (2006.01)
*G06F 12/02* (2006.01)
*G11C 16/10* (2006.01)

(52) U.S. Cl.
CPC .......... *G06F 3/0611* (2013.01); *G06F 3/0655* (2013.01); *G06F 3/0679* (2013.01); *G06F 12/0253* (2013.01); *G11C 16/10* (2013.01); *G06F 2212/7205* (2013.01)

(58) Field of Classification Search
CPC ...... G06F 3/061; G06F 3/0611; G06F 3/0655; G06F 3/0634; G06F 3/0679; G06F 12/0246
See application file for complete search history.

(56) References Cited

U.S. PATENT DOCUMENTS

| | | | |
|---|---|---|---|
| 7,590,794 B2 | 9/2009 | Sinclair et al. | |
| 8,489,739 B2 | 7/2013 | Hisatomi et al. | |
| 8,725,931 B1* | 5/2014 | Kang | G06F 12/0246 710/52 |
| 9,384,123 B2 | 7/2016 | Hida et al. | |
| 2014/0181370 A1* | 6/2014 | Cohen | G06F 12/0246 711/103 |
| 2014/0372684 A1* | 12/2014 | Tressler | G06F 3/0679 711/103 |

(Continued)

OTHER PUBLICATIONS

Hu, Xiao-Yu, et al. "Write amplification analysis in flash-based solid state drives." Proceedings of SYSTOR 2009: The Israeli Experimental Systems Conference. ACM, 2009. (Year: 2009).*

*Primary Examiner* — Charles Rones
*Assistant Examiner* — Hewy H Li
(74) *Attorney, Agent, or Firm* — Kim & Stewart LLP

(57) ABSTRACT

A storage device includes a nonvolatile memory, a communication interface connectable to an external device, and a control circuit. The control circuit is configured to carry out over an elapsed time period first write operations to write data received through the communication interface in the nonvolatile memory, second write operations to write data stored in a memory region of the nonvolatile memory to another memory region of the nonvolatile memory, and wait operations during which no data are written, read, or erased in the nonvolatile memory, such that the wait operations are carried out during a smaller percentage of the elapsed time period as the elapsed time period becomes longer.

12 Claims, 8 Drawing Sheets

(56) References Cited

U.S. PATENT DOCUMENTS

2015/0019801 A1* 1/2015 Yoon .................... G06F 3/0613
                                                        711/103
2016/0224255 A1* 8/2016 Park ..................... G06F 3/0611
2016/0299697 A1* 10/2016 Chen .................... G06F 3/0611

* cited by examiner

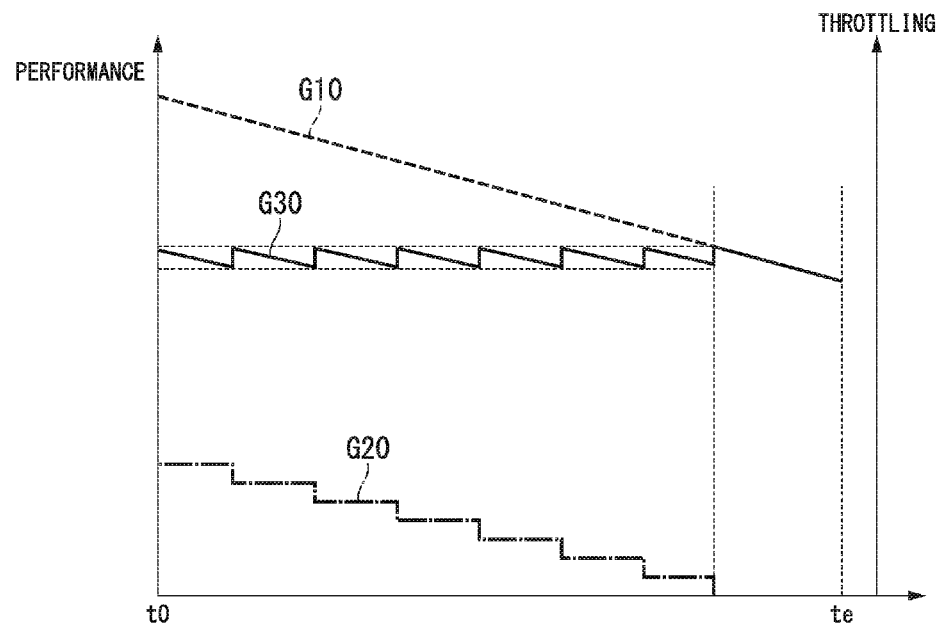

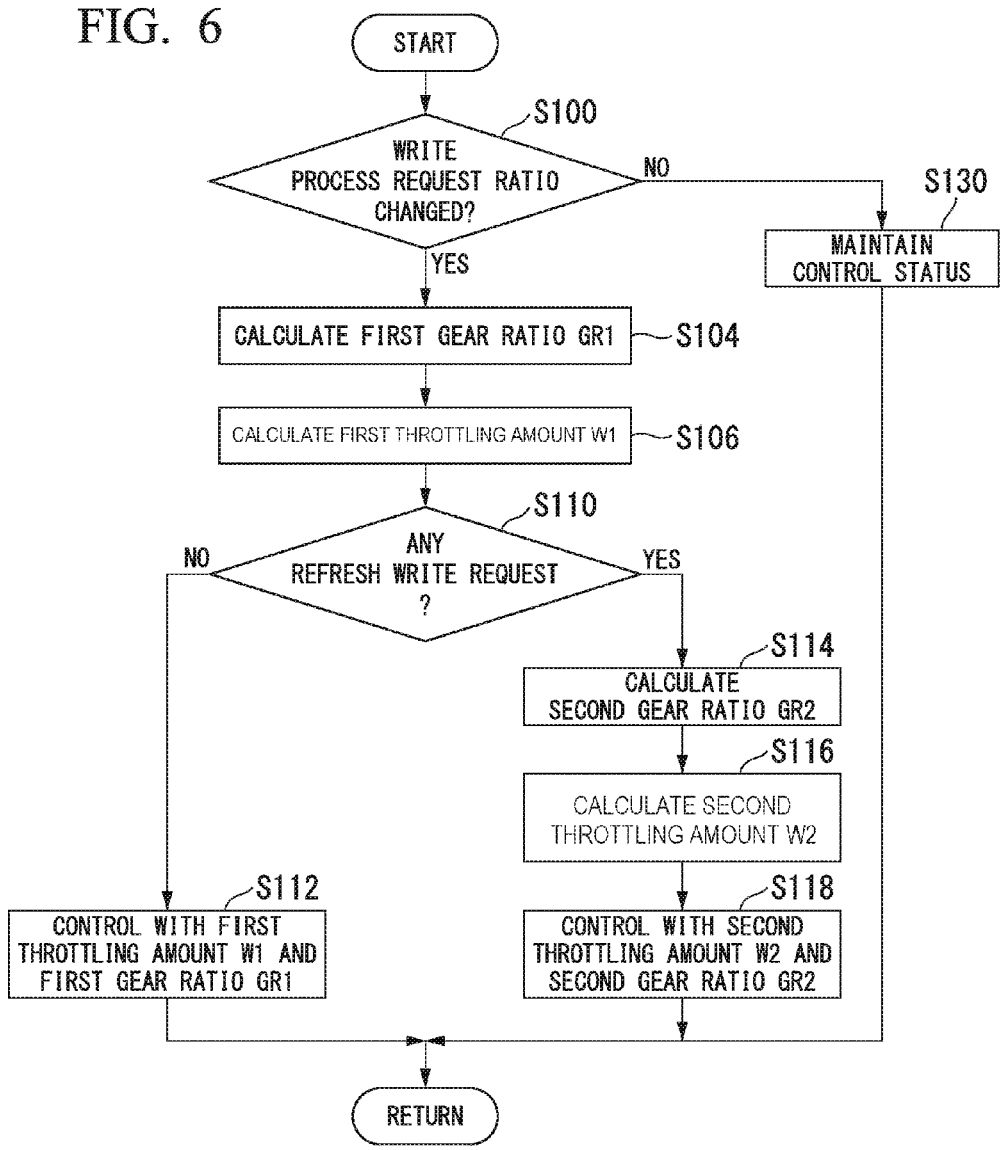

DATA STORAGE DEVICE THAT STABILIZES WRITE LATENCY

CROSS-REFERENCE TO RELATED APPLICATIONS

This application is based upon and claims the benefit of priority from U.S. Provisional Patent Application No. 62/262,093, filed on Dec. 2, 2015, the entire contents of which are incorporated herein by reference.

FIELD

Embodiments described herein relate generally to a storage device, in particular a storage device directed to stabilizing write latencies.

BACKGROUND

A data storage device of one type includes a non-volatile memory such as SSDs (solid state drives) and executes a refresh write process to prevent loss of data stored in the non-volatile memory. The refresh write process is a process of writing at least valid data stored in a target block of the non-volatile memory into a different block. Here, the block is a unit of erasing data from the non-volatile memory.

The refresh write process may be executed with priority over other write processes in order to shorten the time required to complete the refresh write process. However, when a request for writing data is received from a host during the refresh write process, a response indicating the write request has completed may be delayed.

BRIEF DESCRIPTION OF THE DRAWINGS

FIG. 2 illustrates an example of an address management table stored in a data buffer of the data storage device.

FIG. 3 illustrates an example of a block management table stored in the data buffer.

FIG. 4 is a graph of a performance level of the data storage device as passage of time.

FIG. 5 illustrates an example of a throttling ratio translation table.

FIG. 6 is a flowchart illustrating a flow of a process related to throttling amount control which is executed by an SSD controller of the data storage device.

DETAILED DESCRIPTION

A storage device includes a nonvolatile memory, a communication interface connectable to an external device, and a control circuit. The control circuit is configured to carry out over an elapsed time period first write operations to write data received through the communication interface in the nonvolatile memory, second write operations to write data stored in a memory region of the nonvolatile memory to another memory region of the nonvolatile memory, and wait operations during which no data are written, read, or erased in the nonvolatile memory, such that the wait operations are carried out during a smaller percentage of the elapsed time period as the elapsed time period becomes longer.

First Embodiment (Configuration of Data Storage Device)

Figure 1:
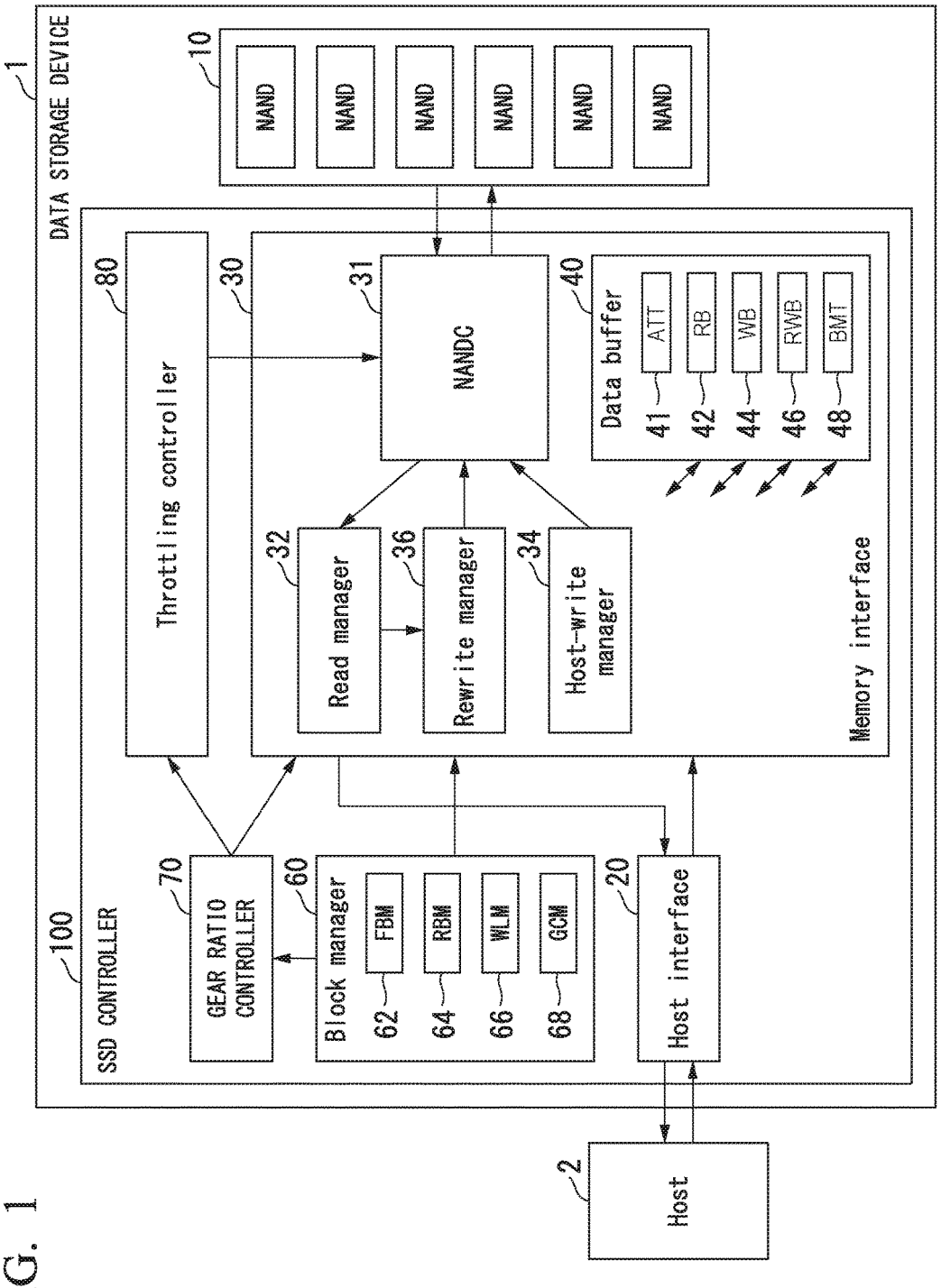
FIG. 1 is a block diagram of a data storage device according to an embodiment.

FIG. 1 is a block diagram of a data storage device 1. While the data storage device 1 may be an SSD (solid state drive), it is not limited thereto.

The data storage device 1 is connected to a host 2 via a host interface 20 such as a SATA (serial ATA) interface, a SAS (serial attached SCSI) interface, etc. The host 2 is an external device which carries out information processing, such as a personal computer, a server device, etc., for example. Moreover, the host 2 may be an imaging and recording device or other devices which include an information processing device. The imaging and recording device includes a mobile terminal having an imaging device such as a still camera and a video camera, and a desktop video server, etc.

When carrying out reading or writing of data, the host 2 includes an LBA (logical block address) as a logical address in a read request or a write request, and outputs the read request or the write request including the LBA to the data storage device 1 via the host interface 20. The LBA is, for example, a logical address in which a serial number starting from zero is assigned to a sector with the size of 512 B, for example.

The host 2 may use arbitrary key information instead of the LBA. In this case, the data storage device 1 performs a process using an address translation table for translating key information to a physical address instead of an address translation table for translating the LBA to the physical address.

The data storage device 1 includes a NAND flash memory (below abbreviated as a NAND, more generally, a non-volatile memory) 10 and an SSD controller (more generally, a memory controller) 100, for example. The NAND 10 and the SSD controller 100 may be accommodated in the same housing, or may be connected via a cable, or via a network including the cable, a wireless communications network, and others.

The NAND 10 includes a non-volatile semiconductor memory and stores therein user data specified by the host 2. The user data are data generated through processing by the host 2 and requested to be stored in the NAND 10 by the host 2 or already stored in the NAND 10.

Moreover, the NAND 10 may store, as backup, management information which is used for the SSD controller 100 to manage data stored in the NAND 10. The backup refers to redundantly holding data in a second storage region which is different from a first storage region to recover data stored in the first storage region when the data are lost or corrupted.

While the NAND 10 may have a memory cell array including a plurality of memory cells arranged in a matrix configuration, it is not limited thereto. The matrix configuration is a configuration in which the elements thereof are lined up in respective directions of a first direction and a second direction which is different from the first direction.

The NAND 10 includes a plurality of memory chips, each of which includes a memory cell array. Each of the memory cell arrays includes a plurality of physical blocks. Each of the physical blocks may include a plurality of pages. Writing of data into the NAND 10 is performed in unit of a cluster. The cluster may have the same size as that of a page in the NAND memory, or a different size therefrom. Erasing of data in the NAND 10 is performed in units of a physical block.

The SSD controller 100 includes the host interface 20 (external interface), a memory interface 30, a block manager 60, a gear ratio controller 70, and a throttling controller 80 (second controller). The memory interface 30, the block manager 60, and the gear ratio controller 70 are an example of "a first control device."

The memory interface 30 includes a NAND controller (below abbreviated as a NANDC) 31, a read manager 32, a host-write manager 34, a rewrite manager 36, and a data buffer 40.

The NANDC 31 includes a NAND interface circuit which perform an interface process for communication with the NAND 10, an error correction circuit, and a DMA controller. The NANDC 31 writes data temporarily stored in the data buffer 40 into the NAND 10, or reads data stored in the NAND 10 and writes the read data into the data buffer 40. The NANDC 31 carries out error correction on data to be written into the data buffer 40 and reports an error and information identifying a block that stored data including the error to the block manager 60.

The data buffer 40 may be a semiconductor memory which is accessible at a speed higher than that of the NAND 10 and which can be randomly accessed. The data buffer 40 is a DRAM (D-Random access memory) or a SRAM (S-Random access memory), for example.

The data buffer 40 includes an address translation table (ATT) 41, a read buffer (RB) 42, a write buffer (WB) 44, a rewrite buffer (RWB) 46, and a block management table (BMT) 48.

Information used for translating between a logical address and a physical address in both ways is stored in the address translation table 41. FIG. 2 illustrates an example of the address translation table 41, which is stored in the data buffer 40. An LBA cluster address, a storage location (physical address: a block number+an intra-block storage location, for example) of the NAND 10 in which cluster data are stored, and a data presence/absence flag which indicates whether data are present in the cluster are registered in each entry of the address translation table 41. The cluster address is a quotient obtained dividing the LBA by the cluster size. The address translation table 41 is used when mapping, from a logical address, a physical address which identifies a storage device in which data corresponding to the logical address are stored. Moreover, when writing of data into the NAND 10 causes the relationship between the cluster address and the storage location of the NAND 10 to differ from each other, the address translation table 41 is updated.

Data (user data) read from the NAND 10 are stored in the read buffer 42 until the data are transmitted to the host 2.

Written data (user data) received from the host 2 are stored in the write buffer 44 until the data are written into the NAND 10.

Valid data extracted from a target block of a garbage collection process (a third process or garbage collection) are stored in the rewrite buffer 46 until the valid data are rewritten to a block to be transferred to.

The garbage collection includes moving at least data (valid data) other than unnecessary data (invalid data) stored in one or more physical blocks (a first storage region) to a different physical block (a second storage region) and re-categorizing the movement-source physical blocks as free blocks so that these physical blocks can be reused. A physical block (the first storage region) in which the unnecessary data are stored is included in the movement-source physical blocks of the garbage collection. To reuse the region in which the unnecessary data are stored, valid data in the movement-source physical blocks are moved (copied) to the different physical block (the second storage region) and the physical blocks from which the valid data has been copied are re-categorized as free blocks by execution of the garbage collection. The unnecessary data are data to which the LBA (logical address) is not associated and the valid data are data to which the LBA is associated. The rewrite buffer 46 may be used in the below-described refresh write process (a fourth process) and a wear leveling process which accompanies rewriting.

Information for managing the status of individual blocks is stored in the block management table 48. Details of the block management table 48 will be described below.

It is not necessary that all of the data buffers 40 (the read buffer 42, the write buffer 44, and the rewrite buffer 46) are collectively formed of a single memory unit, and the data buffers 40 may be separately formed for each of the buffers by a plurality of memory units.

The block manager 60 manages the status of individual blocks of the NAND 10. The block manager 60 includes a free block manager (FBM) 62, a refresh block manager (RBM) 64, a wear leveling manager (WLM) 66, and a garbage collection manager (GCM) 68, for example.

The FBM 62 manages categorization of the individual blocks of the NAND 10 based at least in part on the block management table 48. Categories of the individual blocks of the NAND 10 include an active block and a free block. The active block is a type of block in which the valid data are stored. The free block is a type of block in which no valid data are stored or an erasure process has been completed.

The FBM 62 refers to the block management table 48 to determine whether the block is the active block or the free block.

FIG. 3 illustrates an example of the block management table 48, which is stored in the data buffer 40. In the block management table 48, with respect to each block number of a block, which is block identification information, "used/unused" information that indicates whether the block is an active block or a free block, an "error occurrence flag" which indicates that an error have occurred when data stored in the NAND 10 are read, and "the number of times of rewrites" which indicates the number of times a rewrite process has been carried out on the block, etc., are registered. The "used/unused" information is written by the memory interface 30 in accordance with execution of a writing process by the memory interface 30. The "error occurrence flag" is changed to an error occurrence status by the RBM 64 when the RBM 64 receives a report of an error occurrence from the NANDC 31 and is released from the error occurrence status upon completion of a refresh write process by the memory interface 30 (rewrite manager 36). "The number of times of rewrites" is rewritten by the memory interface 30 (or more specifically, the rewrite manager 36).

Returning to FIG. 1, the RBM 64 is described. The RBM 64 manages a block that needs a refresh write process based at least in part on the block management table 48. The refresh write process is a process of rewriting data stored in a target block to a different block based at least in part on a factor different from the storage density of valid data stored in the block. The factor different from the storage density of the valid data stored in the block includes whether nor not an error occurred in the course of the process of reading data from the block. During the refresh write process, the RBM 64 carries out rewriting of data including at least all valid data stored in the target block. Moreover, the RBM 64 may include data other than the valid data in the target block as data to be rewritten. As an extreme example of the refresh write process, the RBM 64 may carry out rewriting of all data (i.e., both valid data and invalid data) stored in the target block.

The RBM 64 receives a report about an error from the NANDC 31 and detects that an error occurred in the course of the read process from the NAND 10. The RBM 64 specifies a block in which the error occurred from location information reported from the NANDC 31. With respect to the block in which the error occurred, the RBM 64 sets on an error occurrence flag in the block management table 48. That is, the RBM 64 can specify an error occurrence condition by referring to the block management table 48.

Then, based at least in part on the error occurrence condition, the RBM 64 issues an instruction to carry out a refresh write process to the memory interface 30. Moreover, the RBM 64 performs a report that the instruction to carry out the refresh write process have been issued to the gear ratio controller 70. The rewrite manager 36 of the memory interface 30 executes the process in accordance with the instruction.

The RBM 64 carries out specification of the error occurrence condition for each preset period. For example, the RBM 64 includes a counter (not shown) and counts the number of blocks in which an error occurred during the preset period. The RBM 64 monitors the number of blocks for each preset period to detect changing of the error occurrence condition. Moreover, the RBM 64 specify a block in which the error occurred based on the change of the error occurrence condition. The RBM 64 may set the number of blocks in which the error occurred during the period as information on the frequency of requests to carry out the refresh write process based on an error occurrence.

The WLM 66 manages the number of rewrite times for each block of the NAND 10 based at least in part on the block management table 48. The wear leveling is a process of controlling the number of rewrites times such that the numbers become even among blocks or among memory elements. The number of rewrites times is managed by counting the number of times a block has been changed to the free block status through the refresh rewrite process, or counting the number of erase times of the block, for example. In other words, the WLM 66 operates such that the number of rewrite times becomes even amount the blocks of the NAND 10.

The WLM 66 designates a block with a relatively small number of rewrite times as a destination block in which data are to be written based at least in part on the numbers of rewrite times in the block management table 48 (first WL instruction). In response thereto, the host-write manager 34 of the memory interface 30 performs writing into the block with the relatively small number of rewrite times during a write operation of the data designated from the host 2.

Moreover, the WLM 66 issues, to the memory interface 30, an instruction designating an active block with a small number of rewrite times as a block to be rewritten such that data in the active block with the small number of rewrite times are moved and the active block are changed to a free block (second WL instruction). Furthermore, the WLM 66 sends a report that the second WL instruction has been issued to the gear ratio controller 70. The rewrite manager 36 of the memory interface 30 executes a process in accordance with the instruction (second WL instruction). The process in accordance with the second WL instructions is a type of refresh write process, so that the process may be treated as the refresh write process by the gear ratio controller 70.

The GCM 68 performs garbage collection in which a block with a small percentage of occupancy by the valid data is selected from active blocks, data in the selected block are moved to a free block, and then the selected block is remapped as a free block, for example. The GCM 68 issues an instruction to carry out the garbage collection to the memory interface 30. The rewrite manager 36 of the memory interface 30 executes a process in accordance with the instruction.

In the block management table 48, the value of the number of rewrite times of the relevant block is incremented by one every time an external write process (below called a host write process; a first process) requested by the host 2 is performed, and every time an internal write process, such as a garbage collection process (third process) and a refresh write process (fourth process) is performed.

The gear ratio controller 70 calculates a gear ratio and reports, to the memory interface 30, the calculated gear ratio and a notification that the gear ratio has been changed. The gear ratio controller 70 reports, to a throttling controller 80, calculation conditions of the gear ratio and a notification that the gear ratio has been changed. The gear ratio according to the present embodiment includes a first gear ratio GR1 and a second gear ratio GR2. The gear ratio controller 70 sets the second gear ratio GR2 such that a frequency of the host write process when the second gear ratio GR2 is set is less than a frequency of the host write process when the first gear ratio GR1 is set.

Moreover, the calculation conditions of the gear ratio include the number of times of the host write process, the processing frequency of the host write process, the number of times of the garbage collection, the processing frequency of the garbage collection, and the number of times of the refresh write process, and the processing frequency of the refresh write process. The number of times and the processing frequency may be replaced with the number of blocks that are to be written during each unit time.

The first gear ratio GR1 is a target value aimed when the refresh write process is not executed and indicates an execution ratio of the host write process with respect to both of the host write process and the garbage collection process. The first gear ratio GR1 is calculated by dividing the number of times or the processing frequency of the host write process with a sum of the number of times or the processing frequency of the host write process and the number of times or the processing frequency of the garbage collection process. That is, the host write process and the garbage collection process are carried out such that the gear ratio becomes the value of the first gear ratio GR1.

The second gear ratio GR2 is a target value aimed when the refresh write process is executed, and indicates an execution ratio of a host write process with respect to all of a host write process, the garbage collection process, and a refresh write process. The second gear ratio GR2 is calculated by dividing the number of times or the processing frequency of the host write process with a sum of the number of times of processing or the processing frequency of each of the host write process, the garbage collection process, and the refresh write process. That is, the host write process, garbage collection process, and the refresh process are carried out such that the gear ratio becomes the value of the second gear ratio GR2. When the refresh write process is carried out, the gear ratio controller 70 sets the second gear ratio GR2 such that the second gear ratio GR2 is less than the first gear ratio GR1.

The gear ratio controller 70 generates a processing schedule such that processes such as read write control, garbage collection, refresh write, wear leveling, etc., are performed according to the first gear ratio GR1 or the second gear ratio GR2, and causes the memory interface 30 to perform various processes in accordance with the generated schedule. The process of generating the processing schedule may be performed by the memory interface 30.

The memory interface 30 instructs the NANDC 31 to carry out processes such as read write control of data designated from the host 2, garbage collection, refresh write, and wear leveling of the NAND 10, etc.

The read manager 32 carries out a read control of data designated from the host 2. For example, the read manager 32 accepts the read control of the data designated from the host 2 to read the data from the NAND 10 and transmits the read data to the host 2 via the read buffer 42. To carry out garbage collection of the block instructed from the block manager 60, the read manager 32 reads data from the block of the NAND 10 and writes the read data into the rewrite buffer 46.

The host-write manager 34 carries out a write control of the data designated from the host 2. The host-write manager 34 writes data designated by the host 2 into a free block designated by the block manager 60.

Upon input of write data and a write command including an LBA as a write address, the host-write manager 34 writes the write data into the write buffer 44. Upon performing the write process, the host-write manager 34 updates the address translation table 41 and the block management table 48.

As described above, the rewrite manager 36 executes a process of rewriting data read from the NAND 10. Data to be written through the rewrite process includes data to be subjected to the garbage collection process, the refresh write process, or the wear leveling, etc.

If the garbage collection process including the rewriting process, the refresh write process, or the wear leveling process is executed, the rewrite manager 36 remaps the movement-source block as a free block and updates data in the block management table 48. The rewrite manager 36 sets "used/unused" information for the movement-source block in the block management table 48 to "unused", and changes "the error occurrence flag" to no error occurrence.

The first gear ratio GR1 calculated by the gear ratio controller 70 is expressed as M/(M+N), for example. M denotes the frequency or the number of times (below merely described as the frequency) of the host write process, while N denotes the frequency or the number of times of the garbage collection process. The first gear ratio GR1 is a value which is designated from the host 2, etc., or a preset fixed value, for example.

On the other hand, the second gear ratio GR2 calculated by the gear ratio controller 70 is expressed as M/(M+N+R), for example. R shows a frequency of or the number of times of the refresh write process.

M, N, and R respectively take a value equal to or greater than 0. More specifically, when the frequency or the number of times is shown as a scaled degree, each of M, N, and R is set to an integer equal to or greater than 0. When each of the above-described M, N, and R is corresponds to the number of blocks subjected to the process in a unit time, each of M, N, and R is set to an integer equal to or greater than 0.

The above-described memory interface 30, the block manager 60, and the gear ratio controller 70 at least controls execution of a host write process of writing data received from the host 2 via the host interface 20 into the NAND 10. The memory interface 30, the block manager 60, and the gear ratio controller 70 control execution of the garbage collection and the refresh write process in addition to the host write process. Through the garbage collection, valid data within a first storage region of the NAND 10 are moved to a second storage region, and the first storage region is released. In the refresh write process, valid data stored in the NAND 10 are rewritten to a different storage region for each data unit.

The throttling controller 80 carries out a throttling control which intentionally restricts the amount of data written into the NAND 10. The throttling control is carried out to restrict the execution frequency of the processes such as the host write process, the garbage collection process, and the refresh write process, etc., in accordance with an objective thereof. The throttling controller 80 determines the degree of restricting the execution frequency of the process as an throttling amount. The throttling controller 80 may calculate the throttling amount from a calculation condition, which is set based on the execution frequency of the process to be controlled, and a ratio of the execution frequency of the process (the throttling ratio). The throttling controller 80 may set a value indicating the execution frequency of the process to be controlled as the number of blocks to be subjected to the process to be controlled.

A more specific example of the throttling control using the throttling amount is described.

For example, the throttling controller 80 inserts a wait time (a dummy wait operation) by an appropriate amount in a time zone in which the target process is executed to adjust the frequency of the corresponding process for each unit time. During the wait time (wait operation), no data are written to, and read and erased from the NAND 10. The throttling controller 80 may set an amount of such a wait time as the throttling amount and calculate the value thereof from a throttling ratio.

Alternatively, the throttling controller 80 inserts a wait time of a unit time, by an appropriate amount, in a time zone in which the target process is executed, sets the number of times the wait time is inserted as the throttling amount, and calculates the value thereof from the throttling ratio.

In the description below, the wait time in each unit time that is calculated as described above, or the number of times the wait time of a unit time is inserted is referred to as a throttling amount. The number of times the wait time is inserted may be counted using the number of clocks or the number of cycles as a reference.

The throttling control according to the present embodiment is carried out for a process of writing into the NAND 10. In the description below, a unit of the throttling amount is standardized based on the write time required to write data corresponding to one physical block as a reference so that the unit of the throttling amount corresponds to the frequency or the number of times of the write process per unit time or the number of blocks per unit time. That is, the throttling controller 80 may standardize the amount of the wait time (a dummy wait number) to be used as the throttling amount based on the time of writing data corresponding to one physical block, and expresses the throttling amount in the same unit as the frequency or the number of times of a write process or the number of blocks per unit time.

Next, the throttling control carried out in the data storage device 1 is described. The throttling controller 80 may carry out the throttling control for the following objectives, for example:

A first objective may be to reduce variation in performance which may occur between the beginning and the end of the lifetime of the data storage device 1 (also referred to herein as, performance throttling).

A second objective may be to operate the data storage device 1 within the specified power consumption amount (also referred to herein as, power throttling).

A third objective may be to restrict heat generation caused by the operation of the data storage device 1 and to operate the data storage device 1 under the specified temperature conditions (also referred to herein as, temperature throttling).

The throttling controller 80 controls execution of a throttling control (a second process) of decreasing the write performance such that the performance of the host write process is smoothed overtime, and restricts the throttling amount by the throttling control such that the execution amount of the host write process is maintained if the ratio of another write process which is different from the host write process increases. The other write process which is different from the host write process includes at least the refresh write process.

The throttling controller 80 controls the throttling amount of the performance throttling to cause the estimated performance difference between the projected performance value when the data storage device 1 starts to be used after manufacturing of the data storage device 1 and the projected performance value when the lifetime of the device elapsed. For example, the throttling controller 80 adjusts a throttling ratio which determines a throttling amount of the performance throttling based at least in part on the frequency of requests for the refresh write process, which decreases the performance of the host write process. The throttling ratio will be described below. When the frequency of requests for the refresh write process increases, the throttling controller 80 adjusts the throttling ratio such that the throttling amount of the performance throttling decreases to suppress a decrease in the performance of the host write process, a change in latency, a fluctuation in the delay time, etc. The throttling controller 80 can suppress the fluctuation in the performance of the host write process without deviating from the objective of the performance throttling, which is "decreasing the variation in the performance difference in accordance with the elapsing of time."

In this way, if the ratio of another write process which is different from the host write process increases, the throttling controller 80 restricts the throttling amount of the performance throttling.

On the other hand, for the power throttling or the temperature throttling, the throttling controller 80 does not perform a control of adjusting the individual throttling amounts to decrease the performance of the host write process. This is because the power throttling is carried out to achieve the second objective and suppress power consumption and the temperature throttling is carried out to achieve the third objective and suppress the generated heat amount.

The throttling controller 80 calculates the throttling amount based at least in part on the throttling ratio and calculation conditions of the gear ratio. For example, the throttling controller 80 controls the throttling amount so as to cause at least the frequency of the write process of the NAND 10 to be decreased. The throttling controller 80 receives a notification that the calculation conditions of the gear ratio and the gear ratio have changed. The calculation conditions of the gear ratio include data indicating the number of times or the frequency of each of the host write process, the garbage collection process, and the refresh write process, or the number of blocks that is to be subjected to the write process in each unit time. The throttling controller 80 carried out the throttling control to restrict execution of some of the processes.

FIG. 4 is a graph showing performance levels of the data storage device 1 in accordance with passage of time. The graph shown in FIG. 4 shows an accumulated use time (use history information) on the horizontal axis and the performance level of the write process and the throttling amount on the vertical axis. G10 in FIG. 4 shows an estimated performance level of the write process when the frequency of the write process is not adjusted through the performance throttling. As shown in G10, it is anticipated that the performance of the write process would decrease monotonously from time t0 when use of the data storage device 1 started after manufacturing of the data storage device 1 to time to when lifetime of the device elapsed.

In the present embodiment, the throttling controller 80 controls the throttling amount of the performance throttling such that the throttling amount exhibits G20. The throttling controller 80 adjusts the throttling amount of the performance throttling to be smaller as the accumulated use time becomes longer so as to cancel out the performance decrease amount of the write process indicated in G10. For example, the throttling controller 80 sets the throttling amount to be a function of the accumulated use time. As shown in FIG. 4, the throttling controller 80 decreases the throttling amount stepwise each time an accumulated use time of the data storage device 1 reaches the predetermined time. The throttling controller 80 subtracts the throttling amount shown in G20 from the performance value of the write process shown in G10, and a net performance level of the data storage device 1 is calculated shown in G30. In this way, the throttling controller 80 may smooth the fluctuation in the latency, relative to a case in which the throttling amount of the performance throttling is not adjusted.

The throttling controller 80 may use a time measurement device (not shown) and a throttling ratio translation table to control the throttling amount of the performance throttling. FIG. 5 illustrates one example of the throttling ratio translation table. The throttling ratio translation table is stored in the throttling controller 80, for example. "A throttling ratio" to "an accumulated use time" which is measured by the time measurement device (not shown) is stored in the throttling ratio translation table shown in FIG. 5. Data for determining the throttling amount, or, in other words, a dummy wait amount are stored as "the throttling ratio". In other words, the throttling ratio is the frequency or the number of times of a process of writing data of a data amount determined based on a request into the NAND 10, or the number of blocks for each unit time to be subjected to the write process. The throttling controller 80 refers to the throttling ratio translation table based at least in part on the current "accumulated use time" to determine the throttling ratio at that time. The throttling controller 80 calculates the throttling amount based at least in part on the determined throttling ratio.

FIG. 6 is a flowchart illustrating one example of a flow of a process related to the throttling amount control which is executed by the SSD controller 100.

The block manager 60 determines whether the request ratio of write processes of different types has changed (S100). If it is determined that the request ratio has not changed (No in S100), the SSD controller 100 maintains the control status in the write process (S130) and completes the process.

On the other hand, if it is determined by the block manager 60 that the request ratio has changed, the gear ratio controller 70 calculates the first gear ratio GR1 (S104). The gear ratio controller 70 sends the calculated first gear ratio GR1 to the memory interface 30. Moreover, the gear ratio controller 70 sends the condition of calculating the first gear ratio GR1 and that the new gear ratio GR1 has been calculated to the throttling controller 80.

Next, the throttling controller 80 receives the notification from the gear ratio controller 70 and calculates a current throttling ratio sr1 (execution ratio) based at least in part on the accumulated use time of the NAND 10. The throttling controller 80 calculates the number of blocks W1 (below also called merely a first throttling amount W1) that indicates the throttling amount from the current throttling ratio sr1 and the condition of calculating the first gear ratio GR1 (the request amount of the write process, values of M, N, and R, for example) (S106). The method of calculating the first throttling amount W1 will be described below.

Next, the gear ratio controller 70 determines whether there is any refresh write request based at least in part on a notification from the block manager 60 (S110). Here, the gear ratio controller 70 determines that there is a refresh write request in both of a case in which a notification of an instruction for a refresh write process is made by the RBM 64 and a case in which a notification of the second WL instruction is made by the WLM 66.

When there is no refresh write request (No in S110), the throttling controller 80 controls the memory interface 30 so that the throttling amount becomes the first throttling amount W1 calculated in S106. Moreover, the throttling controller 80 controls the NANDC 31 to execute the write process at the first gear ratio GR1 calculated by the gear ration controller 70 in S104 (S112) and completes the process.

On the other hand, when there is a refresh write request (Yes in S110), the gear ratio controller 70 calculates the second gear ratio GR2 (S114). The gear ratio controller 70 sends the second gear ratio GR2 calculated in S114 to the memory interface 30. Moreover, the gear ratio controller 70 sends conditions for calculating the second gear ration GR2 in S114 and a notification that a new gear ratio GR2 has been calculated to the throttling controller 80.

Next, upon receiving the notification from the gear ratio controller 70, the throttling controller 80 calculates the current throttling ratio sr1 based at least in part on the accumulated use time of the NAND 10. The throttling controller 80 calculates a throttling ratio sr2 (correction execution ratio) from the current throttling ratio sr1 and the condition for which the second gear ratio GR2 is calculated in S114 (write process request amount, for example values of M, N, R) and calculates the number of blocks W2 (below also called merely a second throttling amount W2) that indicates the throttling amount from the throttling ratio sr2 (S116). The calculation method of the second throttling amount W2 will be described below.

Next, the throttling controller 80 controls the memory interface 30 so that the throttling amount becomes the calculated second throttling amount W2, and controls the NANDC 31 to execute a write process at the second gear ratio GR2 which is calculated by the gear ratio controller 70 (S118). Then, the process ends.

The request amount for the write process may be determined based at least in part on results of detecting requests for each of the host write process, the garbage collection process, and the refresh write process by the block manager 60.

(Throttling Amount Control)

A method of calculating the throttling amount is described below. The throttling controller 80 calculates a virtual number of blocks W that indicates the throttling amount using the following equation (1):

$$W=(M+N+R)\times(sr) \qquad (1)$$

In the above equation (1), M, N, and R respectively indicate the number of blocks for performing a host write process; the number of blocks for performing garbage collection, and the number of blocks for performing a refresh write process. sr indicates a throttling ratio.

In this case, the total time T required to perform a host write process for the number of blocks M can be calculated from the following equation (2) based at least in part on the total value of the block numbers of the individual processes:

$$T=(M+N+R+W)\times UT \qquad (2)$$

UT in the above equation (2) is a unit time required for the process of writing one block.

Moreover, the host write process ratio h in this case can be calculated from the following equation (3):

$$h=M/(T/UT)=M/(M+N+R+W) \qquad (3)$$

When the request for the refresh write process is not present (R=0), the above equation (1) may be converted to the following equation (4). The throttling controller 80 calculates the number of blocks W1 that indicate the throttling amount when the request for the refresh write process is not present, using the following equation (4). The throttling ratio (execution ratio) in this case is set to be sr1.

$$W1=(M+N)\times(sr1) \qquad (4)$$

A first total value T1 can be calculated using the following equation (5) based at least in part on the total number of blocks of the number of blocks M for performing a host write process; the number of blocks N for performing garbage collection; and the first throttling amount W1:

$$T1=(M+N+W1)\times UT=(M+N)(1+sr1)\times UT \qquad (5)$$

Moreover, the host write process ratio h1 (first target ratio) in this case can be calculated from the following equation (6):

$$h1=M/(T1/UT)=M/(M+N+W1) \qquad (6)$$

On the other hand, when the request for the refresh write process is present (R≠0), the above-described equation (1) may be converted to the following equation (7). The throttling controller 80 calculates a second throttling amount W2 which is a throttling amount when the request for the refresh write process is not present by the following equation (7). The throttling ratio in this case is set to sr2:

$$W2=(M+N+R)\times(sr2) \qquad (7)$$

The throttling controller 80 calculates the throttling ratio sr2 in the above equation (7) in accordance with the equation (8).

$$sr2=\{(M+N)\cdot sr1\}/(M+N+R)-\{R/(M+N+R)\} \qquad (8)$$

The value of the throttling ratio sr2 is set to be a value of at least 0 and smaller than the value of the throttling ratio sr1.

For example, as shown in equation (8), the throttling controller 80 multiplies a throttling ratio sr1 by a sum of the number of blocks N for garbage collection and the number of blocks M for the host write process when the refresh write process is not executed. The throttling controller 80 divides the product of the multiplication by a sum of the number of blocks M for the host write process, the number of blocks N for the garbage collection, and the number of blocks R for the refresh write process when the refresh write process is executed, and calculates the first term (the first quotient) of equation (8). The throttling controller 80 divides the number of blocks R for the refresh write process by a sum of the number of blocks M for the host write process, the number of blocks N for the garbage collection, and the number of blocks R for the refresh write process when the refresh write process is executed, and calculates the second term (the second quotient) in equation (8). The throttling controller 80 subtracts the second term from the first term of the equation (8) to calculate the throttling ratio sr2.

In this way, the throttling controller 80 calculates the throttling ratio sr2 based at least in part on the throttling ratio sr1 that is set based at least in part on the use history information of the NAND 10, and the write process request amount (for example, a value of (M+N+R), for example). The throttling controller 80 calculates the second throttling amount W2 based at least in part on the throttling ratio sr2 and the above-described write process request amount, and adjusts the throttling amount to become the calculated second throttling amount W2.

When the frequency of the request for the refresh write process increases, the throttling ratio sr2 calculated from the above equation (8) may take a negative value. In such a case, the throttling controller 80 sets the throttling ratio sr2 to 0. As a result, the throttling controller 80 sets the second throttling amount W2 in this case to zero.

The second total value T2 of the number of blocks M for performing the host write process, the number of blocks N for performing the garbage collection, the number of blocks R for performing the refresh write process, and the second throttling amount W2 can be calculated from the following equation (9):

$$T2=(M+N+R+W2)\times UT \tag{9}$$

Moreover, the host write process ratio h2 (the second target ratio) in this case can be calculated from the following equation (10):

$$h2=M/(T2/UT)=M/(M+N+R+W2) \tag{10}$$

When conditions of the above-described equations (7) and (8) are met, by incorporating the equations (7) and (8) into the equation (10), the host write process ratio h2 can be expressed by equation (11):

$$h2=M/((M+N)(1+sr1))=M/(M+N+W1) \tag{11}$$

As shown in the above-described equations (6) and (11), the throttling controller 80 adjusts the second throttling amount W2 by adjusting the throttling ratio 2 such that the host write process ratio h2 becomes equal to the above-described host write process ratio h1.

Figure 7:
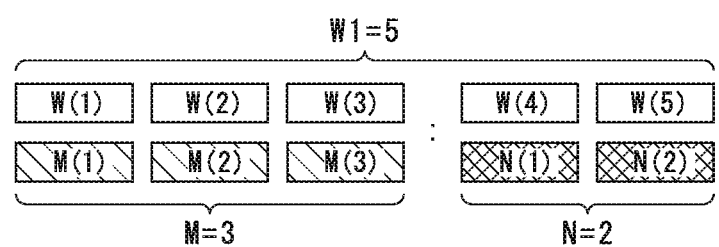
FIGS. 7 and 8 each schematically illustrate blocks to explain a method of calculating a throttling amount.
Figure 8:
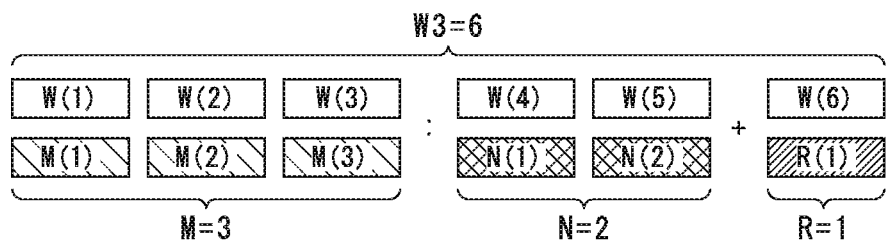

FIGS. 7 and 8 schematically illustrate blocks to explain examples of a method of calculating the throttling amount.

The example shown in FIG. 7 shows a relationship between the number of blocks which are subject to the above-described respective processes and the throttling amount when the refresh write process is not performed and the host write process and the garbage collection process are executed.

Here, the blocks for the host write proves are indicated by M(1), M(2), and M(3), the blocks for the garbage collection process are indicated by N(1) and N(2), and virtual blocks indicating the throttling amount are indicated by W(1) to W(5).

The example in FIG. 7 corresponds to a case in which the number of blocks M for performing the host write process is 3, the number of blocks N for performing the collection is 2, and the throttling ratio sr1 is 1. When the throttling ratio sr1 is 1, a wait time which is equal to a time in which data corresponding to one block is written is set as a first throttling amount W1. The throttling controller 80 calculates the number of blocks W1 that shows the throttling amount by the following equation (12) derived from the equation (4):

$$W1=(M+N)\times(sr1)=(3+2)\times1=5 \tag{12}$$

As described above, when the throttling ratio sr1 is 1, M is 3, and N is 2, the number of blocks that are actually written for each unit time is 5 blocks.

The first total value T1 of the number of blocks M for performing the host write process, the number of blocks N for performing the garbage collection, and the first throttling amount W1 is calculated as 10 from the above equation (5).

Similarly, the host write process ratio h1 in this case is calculated as (3/10) when M=3, N=2, and W1=5 are incorporated in the above-described equation (6).

FIG. 8 shows a case in which a request for the refresh write process is made in the condition shown in FIG. 7. Here, the blocks for the host write process are indicated by M(1), M(2), and M(3), the blocks for the garbage collection are indicated by N(1) and N(2), the virtual blocks showing the throttling amount are indicated by W(1) to W(6), and the block for the refresh write process is indicated by R(1). In FIG. 8, the number of blocks M for performing the host write process is 3, the number of blocks N for performing the garbage collection is 2, the number of blocks N for performing the refresh write process is 2. That is, the ratio M:N:R is 3:2:1. As a result, when M is 3, N is 2, and R is 1, the number of blocks written for each unit time will increase by 1 block and becomes 6 blocks. When the throttling ratio sr is set to be 1 in the same manner as FIG. 7 as described above, a wait time in an amount equal to the time in which data corresponding to one block is written is set as a throttling amount W. The throttling controller 80 calculates the following equation (13) from the above-described equation (1) and calculates the number of blocks W3 showing the throttling amount.

$$W3=(M+N+R)\times(sr1)=(3+2+1)\times1=6 \tag{13}$$

In this case, the total time T needed to perform the host write process for the number of blocks M corresponds to the total of writing data in 12 blocks (=(3+2+1+6)) when calculated from the following equation (14):

$$h3=M/(M+N+R+W2)=3/(3+2+1+6)=(3/12) \tag{14}$$

In this way, when specifying the throttling amount as described above, the host write process ratio h3 is decreased to (3/12).

On the other hand, the throttling controller 80 sets the value of the throttling ratio sr2 which is newly set instead of the value of the throttling ratio sr to be at least zero and less than the value which is set when the block for the refresh write process is absent. In the above case, the throttling ratio sr1 is set to 1, so that the value of the throttling ratio sr2 that is newly set is set such that $0 \leq sr2 < 1$. For example, the throttling controller 80 calculates the throttling ratio sr2 from the equation (8). In this way, as shown in the equation (11), the value of the host write process ratio h2 may be maintained as the same as when the block for the refresh write process is absent.

By performing control as in the above-described manner, the throttling controller 80 may determine a desired throttling ratio sr2 which may maintain the host write process ratio h when the block for the refresh write process is present and when the block for the refresh write process is absent.

In the foregoing, an example of a method of adjusting the throttling amount has been described when a request for the refresh write process is made. When the status transitions in a reverse manner, the following operation may be performed.

If the throttling controller 80 transitions from a status in which a request for the refresh write process is present to a status in which the request is absent, the throttling controller 80 switches the throttling ratio again to the throttling ratio sr1 which is set before changing to the throttling ratio sr2. In this way, the control status may be changed while maintaining the host write process ratio h.

If the condition to determine the gear ratio is changed to a value which is different from what is described above, the throttling controller 80 calculates the throttling ratio sr and the throttling amount W based at least in part on the changed condition. Even in this case, the host write process ratio h can be maintained by the same operation as the one described above.

Figure 9:
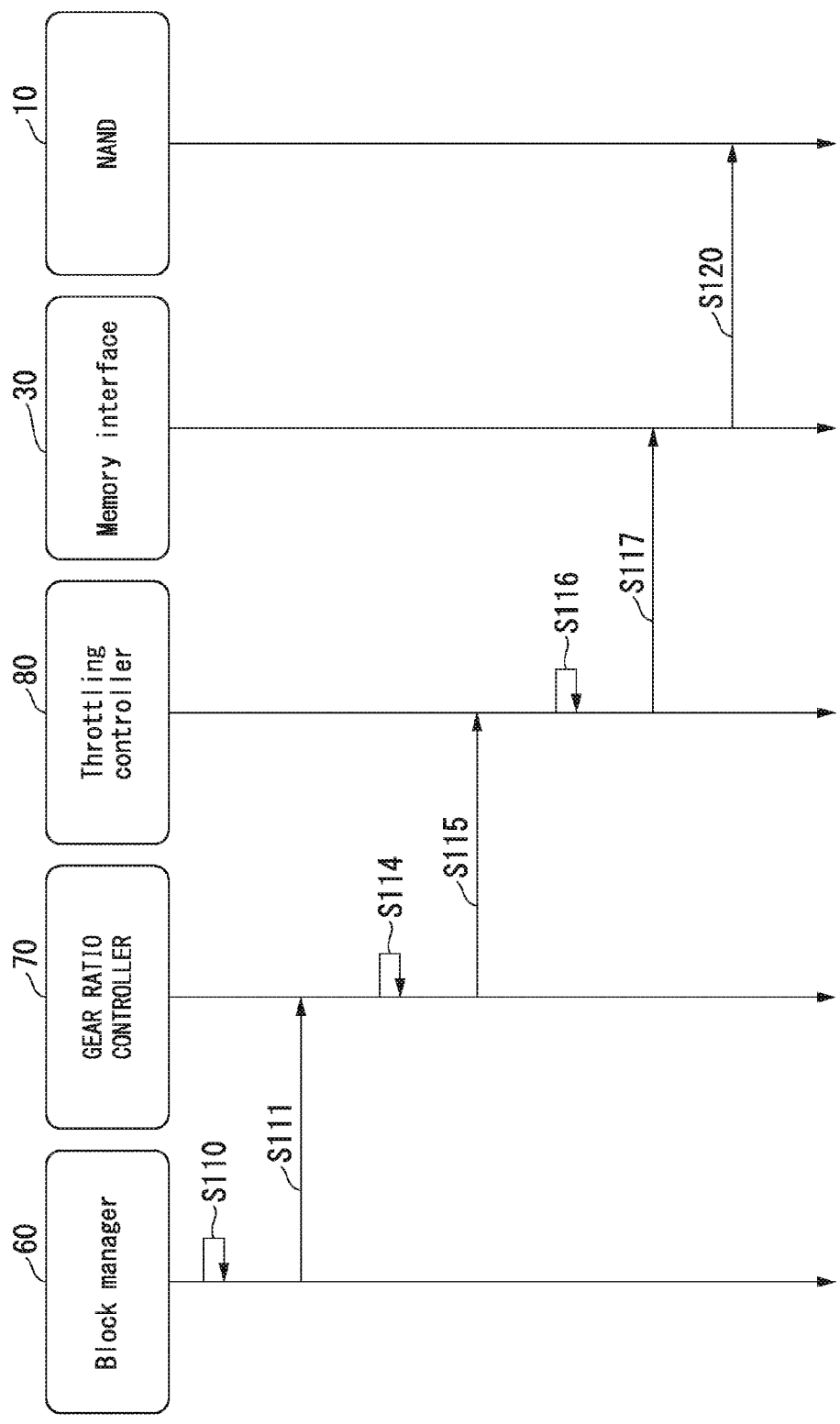
FIGS. 9 and 10 are each a sequence diagram of an operation carried out by the SSD controller.
Figure 10:
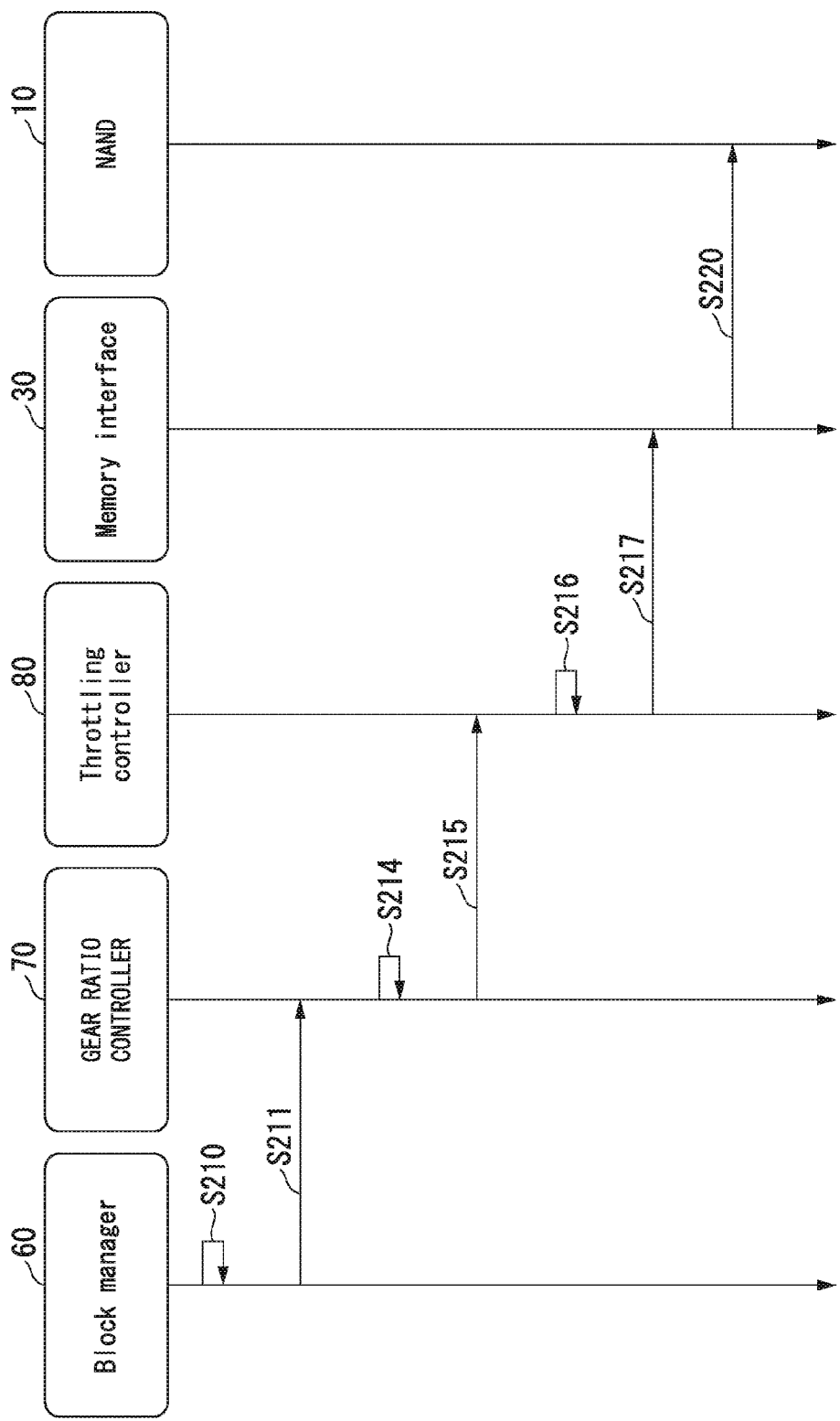

FIGS. 9 and 10 are sequence diagrams for explaining one example of an operation carried out by the SSD controller 100. FIG. 9 corresponds to a case of transitioning from a status in which a request for the refresh write process is absent to a status in which the request for the refresh write process is made. FIGS. 6 and 9 show same processes with same step numbers, respectively.

The block manager 60 detects one or more blocks that need the refresh write process (below called the refresh block) (S110). The block manager 60 reports the detection of R refresh blocks to the gear ratio controller 70 to request a change from the first gear ratio GR1 to the second gear ratio GR2 (S111).

Next, the gear ratio controller 70 which received a request for changing the gear ratio calculates the second gear ratio GR2 and reports to the memory interface 30 that the gear ratio is changed to the calculated second gear ratio GR2 (S114). Moreover, the gear ratio controller 70 reports the condition under which the second gear ratio GR2 is calculated (a required amount for the write process, e.g., values of M, N, and R) and that a new gear ratio GR2 has been calculated to the throttling controller 80 (S115).

Next, upon receiving a report from the gear ratio controller 70, the throttling controller 80 calculates the second throttling amount W2 based at least in part on the condition in which the second gear ratio GR2 is calculated and the throttling ratio sr2 (S116). The throttling controller 80 reports a calculated second throttling amount W2 to the memory interface 30 to set the reported result as a new throttling amount (S117).

Next, based at least in part on the newly-set second throttling amount W2 and second gear ratio GR2, the memory interface 30 executes a processing of writing into the NAND 10 (S120).

FIG. 10 illustrate a case of transitioning from a status in which a request for the refresh write process is present to a status in which the request for the refresh write process ceases is not present.

The block manager 60 detects that there is no unprocessed refresh block (S210). The block manager 60 reports that there is no refresh block to the gear ratio controller 70 to request a change from the second gear ratio GR2 to the first gear ratio GR1 (S211).

The gear ratio controller 70 which received the request for changing the gear ratio changes the gear ratio to the first gear ratio GR1 and reports the change to the memory interface 30 (S214). Moreover, the gear ratio controller 70 reports that there is no refresh block and that the gear ratio is changed to the first gear ratio GR1 to the throttling controller 80 (S215).

Next, the throttling controller 80 receives a report from the gear ratio controller 70 and changes the throttling amount back from the second throttling amount W2 to the first throttling amount W1 (S216). The throttling controller 80 reports the changed first throttling amount W1 to the memory interface 30 to set the reported result as a new throttling amount (S217).

Next, the memory interface 30 executes a process of writing into the NAND 10 based at least in part on the newly-set first throttling amount W1 and first gear ratio GR1 (S220).

Figure 11:
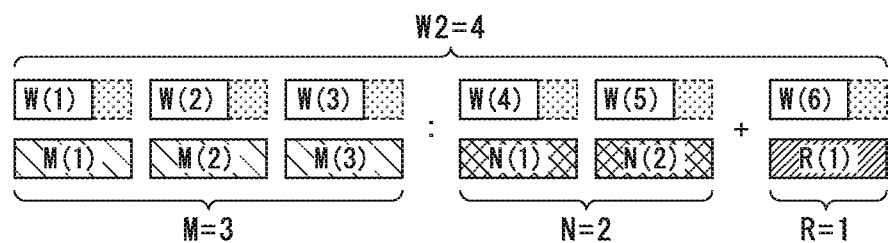
FIG. 11 schematically illustrates blocks after a throttling amount is adjusted.

FIG. 11 schematically illustrates blocks to show the result of adjusting the throttling amount as described above. The ratio of the number of blocks in FIG. 11 is M:N:R in the same manner as in FIG. 8, and the values thereof are M=3, N=2, and R=1 n the same manner as in FIG. 8.

Applying M=3, N=2, R=1, and sr=1 to the equation (8), (2/3) is obtained as the throttling ratio sr2.

As a result of the above process by the throttling controller 80, the write time corresponding to 4 blocks may be assigned to the second throttling amount W2. The host write process ratio h2 is maintained to the same value when the request for the refresh write process is not made.

As shown in FIG. 11, the second throttling amount W2 may be distributed among blocks indicating wait times, or may be concentrated in a certain block. The assignment of the second throttling amount W2 to blocks showing the wait times may be carried out by the throttling controller 80 or by the memory interface 30.

As described above, the throttling controller 80 switches between a first throttling amount W1 (a first execution amount) when a refresh write process is not executed and a second throttling amount W2 (a second execution amount) when a refresh write process is executed in accordance with the presence/absence of the request for the refresh write process. In this way, the throttling controller 80 may adjust the throttling amount included for each unit time in accordance with the presence/absence of the request for the refresh write process and adjusts an execution amount of the write process for each unit time.

The data storage device 1 or the SSD controller 100 according to the present embodiment includes the host interface 20, the memory interface 30, and the throttling controller 80. The throttling controller 80 controls a write process of writing data into the NAND 10 via the memory interface 30. The throttling controller 80 determines an execution amount of the write process for each unit time such that the change of the performance level of the write process is smoothed. When a ratio of the host write process of writing data received from the host 2 via the host interface 20 into the NAND 10 and a write process which is different from the host write process, or a different write process requested by the memory controller is changed, the throttling controller 80 adjusts the determined execution amount of the write process for each unit time to maintain the execution amount of the host write process for the unit time.

In this way, when the data storage device 1 receives a data write request from the host 2, the data storage device 1 or the SSD controller 100 makes an adjustment such that the execution amount of the host write process for each unit time is maintained, and carries out a write process including a host write process. In this way, the data storage device 1 or the SSD controller 100 can maintain a write speed in data writing in response to a data write request by an external device and avoid a delay.

Moreover, according to the data storage device 1 of the present embodiment, the memory interface 30, the block manager 60, and the gear ratio controller 70 at least controls execution of a host write process of writing data received from the host 2 via the host interface 20 into the NAND 10. The throttling controller 80 controls execution of a process of adjusting the throttling amount of the throttling control which decreases the write performance such that the change of the performance level of the host write process is smoothed. When the ratio of other write processes which are different from the host write process increases, the throttling controller 80 restricts the throttling amount of the throttling control to maintain the execution amount of the host write process. In this way, the data storage device 1 can adjust the throttling amount of the throttling control which causes the write performance level to decrease such that the change of the performance level of the host write process is smoothed, making it possible to restrict the throttling amount of the throttling control to maintain the execution amount of the host write process if the ratio of other write processes which are different from the host write process increases. The above-described data storage device 1 may maintain the write speed of data writing in response to the data write request from the host if the data write request is received during the refresh write process and avoid a delay.

Moreover, according to the data storage device 1 of the present embodiment, the memory interface 30, the block manager 60, and the gear ratio controller 70 control the garbage collection and the refresh write process in addition to the host write process. The throttling controller 80 adjusts the throttling amount included for each unit time to adjust the execution amount of the write process for each unit time. The throttling controller 80 switches between the first throttling amount W1 and the second throttling amount W2 in accordance with the presence/absence of a request for the refresh write process. When the refresh write process is not executed, throttling control is executed with the first throttling amount W1, while, when the refresh write process is executed, the throttling control is executed with the second throttling amount W2. In this way, the data storage device 1 switches between the first throttling amount W1 and the second throttling amount W2 in accordance with the presence/absence of a request for the refresh wrote process and adjusts the execution amount of the write process for each unit time.

Moreover, according to the data storage device 1 of the present embodiment, the throttling controller 80 adjusts the second throttling amount W2 such that the host write process ratio h1, which is a ratio of the number of blocks M for the host write process to a first total value T1 is equal to the host write process ratio h2, which is a ratio of the number of blocks M for the host write process to a second total value T2. The first total value T1 is a sum of the numbers of blocks (M+N) for the host write process and the garbage collection when the refresh write process is not executed and the first throttling amount W1. The second total value T2 is a sum of the numbers of blocks (M+N+R) for the host write process, the garbage collection, and the refresh write process when the refresh write process is executed and the second throttling amount W2. In this way, the data storage device 1 may adjust the second throttling amount W2 such that the host write process ratio h1 is equal to the host write process ratio h2. According to the data storage device 1, even if the second throttling amount W2 is adjusted in accordance with the presence/absence of a request for the refresh write process, the host write process ratio h1 and the host wrote process ratio h2 can be set to an equal value.

Moreover, according to the data storage device 1 of the embodiments, the throttling controller 80 determines a first throttling amount W1 when the refresh write process is not executed based at least in part on the first throttling ratio sr1. The throttling controller 80 calculates the second throttling ratio sr2 based at least in part on the above-described write process request amount and the first throttling ratio sr1 set based at least in part on use history information of the NAND 10 and calculates the second throttling amount W2 when the refresh write process is executed based at least in part on the above-described second throttling ratio sr2 and the second throttling ratio sr1. In this way, the data storage device 1 can adjust the second throttling amount W2 based at least in part on the above-described write process request amount and the second throttling ratio sr2.

Second Embodiment

Figure 12:
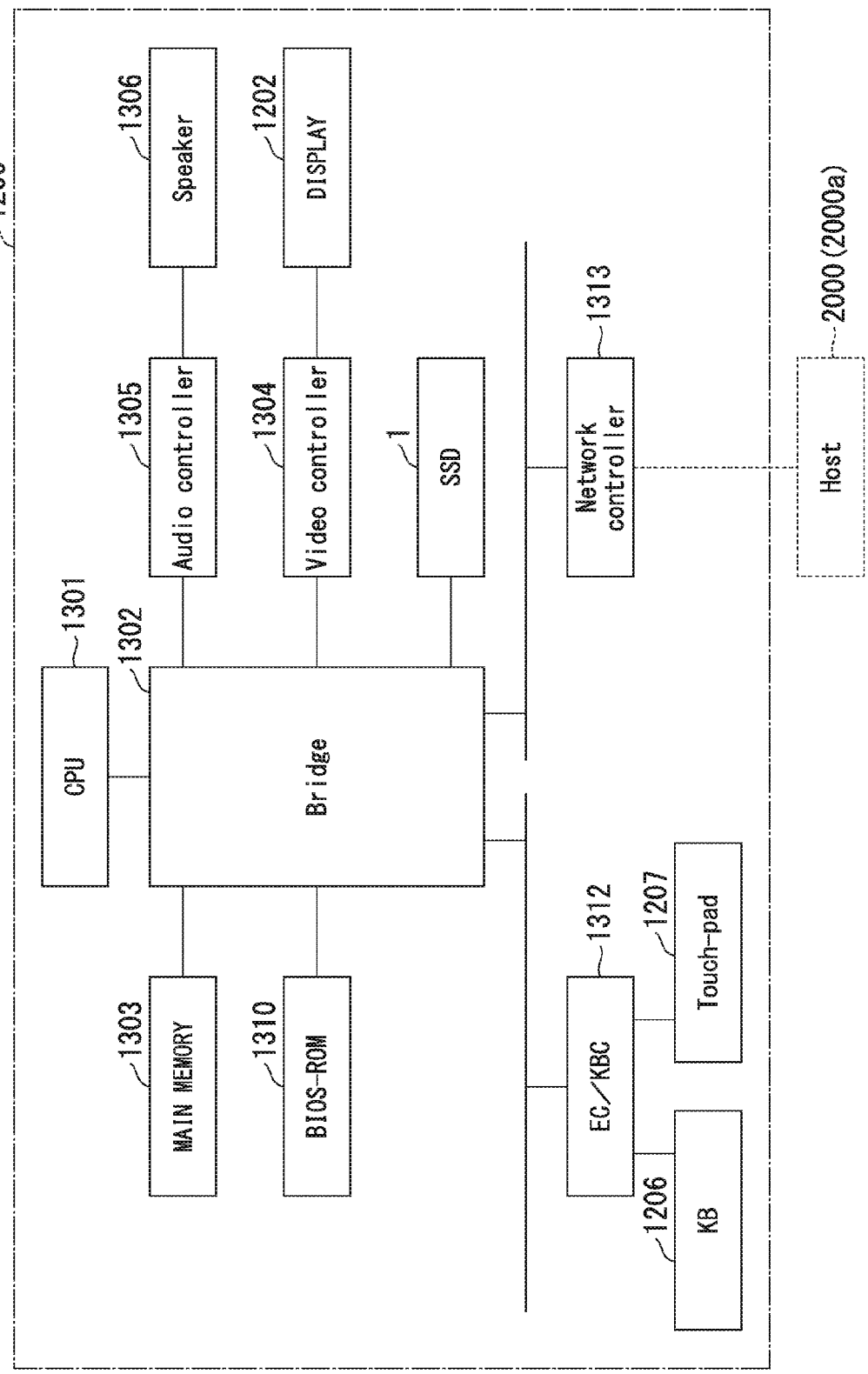
FIG. 12 is a block diagram of a personal computer including the data storage device.

FIG. 12 illustrates an example of a personal computer which includes the data storage device (SSD) 1 according to the first embodiment. A personal computer 1200 includes a display 1202, a keyboard (KB) 1206, and a touch-pad 1207, which is a pointing device. The personal computer 1200 further includes a CPU 1301, a bridge 1302, a main memory 1303, a video controller 1304, an audio controller 1305, a speaker 1306, a BIOS-ROM 1310, the SSD (one example of the data storage device) 1, an embedded controller/keyboard controller IC (EC/KBC) 1312, and a network controller 1313.

The CPU 1301 executes various programs including an operating system (OS), which are loaded to the main memory 1303 from the data storage device 1, etc., to cause the personal computer 1200 to execute various processes. The CPU 1301 also carries out a process related to a BIOS (basic input output system) stored in the BIOS-ROM 1310.

The bridge 1302 includes an interface which accommodates a local bus of the CPU 1301, an interface which accommodates various buses to which various peripheral devices are connected, and interfaces for the BIOS-ROM 1310 and for a memory controller of the main memory 1303. The main memory 1303 temporarily stores therein various programs and data, and functions as a work area for the CPU 1301.

The bridge 1302 communicates with the video controller 1304, the audio controller 1305, the EC/KBC 1312, and the network controller 1313, which are peripheral devices. The video controller 1304 controls displaying of the display 1202. The audio controller 1305 controls sound output from the speaker 1306. The EC/KB 1312 includes an embedded controller (not shown) which manages power such as a power storage amount, etc., of a battery (not shown), and a keyboard controller (not shown) which controls the keyboard (KB) 1206 and the touch-pad 1207. The EC/KBC 1312 detects an operation of a power button (not shown) to control the power supply state of the personal computer 1200 in accordance with detected results. The network controller 1313 communicates with a host 2000.

The bridge 1302 controls the data storage device 1 via an SATA interface, for example. Various programs and data are stored in the data storage device 1. The personal computer 1200 reads and writes data of the data storage device 1 in units of sectors. The personal computer 1200 provides various commands such as a write command, a read command, a flash command, etc., to the data storage device 1 via an SATA interface, for example.

The personal computer 1200 including the data storage device 1 may communicate with a different host 2000a via the network controller 1313. The host 2000a is, for example, a different personal computer, a server device, an imaging and recording device, etc. The imaging and recording device includes a mobile terminal having an imaging device such as a still camera, a video camera, etc., or a desktop video server, etc. Here, the personal computer 1200 (the data storage device 1) may be used as an external storage device of the host 2000a to cause the personal computer 1200 to function as a data storage device. In this case, the CPU 1301 of the personal computer 1200, the network controller 1313, or other functional devices may execute all or at least a part of the processes executed by the individual functional devices of the controller 100 on behalf of the individual functional devices of the SSD controller 100. Even if a request for writing data is received from a host 2000a, such a personal computer 1200 (data storage device) can reduce an influence of the refresh write process with respect to the NAND 10 by the data storage device 1, and maintain the write speed for the request for writing the data of the host 2000a and avoid a delay.

The data storage device 1 according to the at least one embodiment described above has the host interface 20 connectable to the host 2. The memory interface 30, the block manager 60, and the gear ratio controller 70 at least controls execution of a host write process of writing data received from the host 2 via the host interface 20 into the NAND 10. The throttling controller 80 controls execution of a process of adjusting a throttling amount of a throttling control that results in smoothing latency of the host write process, and restricts the throttling amount of the throttling control to maintain an execution amount of the host write process in accordance with the necessity of execution of a different write process requested by the memory controller differently from a write process by the host write process.

According to the above-described embodiment, when a request for writing data is received from the host 2, the data storage device 1 may restrict execution of the refresh write process without decreasing an execution amount of the host write process. In this way, the data storage device 1 may maintain the write speed of data writing in response to the request for writing the data of the host 2000a and avoid a delay.

Moreover, the data storage device 1 according to the above-described embodiment can maintain the write speed of data writing in response to a data write request from the host 2 and avoid a delay with a simple process of adjusting a throttling amount without carrying out a host write process, a garbage collection process, and a refresh write process with a complex adjustment such as scheduling thereof when executing the above-described refresh write process.

When a refresh write process is carried out unexpectedly, and when garbage collection needs to be carried out preferentially, merely changing the gear ratio would cause the latency of the host write process to fluctuate. Even in such a case, by adjusting the throttling amount in accordance with the above-described technique, garbage collection that needs to be carried out urgently can be carries out without inviting any change in the latency of the host write process.

In the above embodiments, information corresponding to at least one of the accumulated number of times of writes and the accumulated number of times of erases may be selected besides the accumulated use time of the NAND 10 as use history information of the NAND 10.

In the above embodiments, the gear ratio controller 70 may calculate the above-described first gear ratio GR1 and second gear ratio GR2 from a value indicating the common condition as the condition for calculating the throttling amount to control the calculated gear ratio to be brought to a predetermined gear ratio.

In the above embodiments, the gear ratio controller 70 may calculate the above-described first gear ratio GR1 and second gear ratio GR2 as described below.

In the above embodiments, the gear ratio controller 70 may set the first gear ratio GR1 to be a ratio of the total of the number of times of processing or the processing frequency of a read process and a write process by a request from the host 2 with respect to the total of the number of times of processing or the processing frequency of processes such as the read process and the write process by the request from the host 2, and a garbage collection process, etc., for example. Moreover, the gear ratio controller 70 may set the second gear ratio GR2 to be a ratio of the number of times of processing or the processing frequency of the read process and the write process by the request from the host 2 with respect to the total of the number of times of processing or the processing frequency of processes such as the read process and the write process by the request from the host 2, the garbage collection process, and a refresh write process, etc.

While certain embodiments have been described, these embodiments have been presented by way of example only, and are not intended to limit the scope of the inventions. Indeed, the novel embodiments described herein may be embodied in a variety of other forms: furthermore various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A storage device comprising:
a nonvolatile memory;
a communication interface connectable to an external device; and
a control circuit configured to carry out first write operations to write data received through the communication interface in the nonvolatile memory, second write operations to write data stored in a memory region of the nonvolatile memory to another memory region of the nonvolatile memory, third write operations to write data stored in a memory region of the nonvolatile memory to another memory region of the nonvolatile memory, the third write operations being different from the second write operations, and wait operations during which no data are written, read, or erased in the nonvolatile memory, such that:
during a first duration of time, a first ratio of (A) a time period spent for the first write operations to (B) a sum of time periods spent for the first and second write operations and the wait operations during a first sub duration of time during which no third write operations are carried out, becomes equal to a second ratio of (A) the time period spent for the first write operations to (C) a sum of time periods spent for the first, second, and third write operations and the wait operations during a second sub duration of time during which the third write operations are carried out, during a second duration of time after the first duration of time, the first ratio becomes equal to the second ratio, and a third ratio of (D) a time period spent for the wait operations to (B) the sum of time periods spent for the first and second write operations and the wait operations during the first sub duration of time in the second duration of time, becomes less than a fourth ratio of (D) the time period spent for the wait operations to (B) the sum of time periods spent for the first and second write operations and the wait operations during the first sub duration of time in the first duration of time.

2. The storage device according to claim 1, wherein the control circuit maintains a table indicating correspondence between different durations of time and predefined ratios, and determines the time period spent for the wait operations during the first sub duration of time based on a corresponding one of the predefined ratios.

3. The storage device according to claim 1, wherein each of the second write operations includes a garbage collection, and each of the third write operations includes a refresh operation.

4. The storage device according to claim 1, wherein the nonvolatile memory is a nonvolatile semiconductor memory.

5. A method of controlling operations performed on a nonvolatile memory, comprising:

carrying out over an elapsed time period first write operations to write data received through the communication interface in the nonvolatile memory, second write operations to write data stored in a memory region of the nonvolatile memory to another memory region of the nonvolatile memory, third write operations to write data stored in a memory region of the nonvolatile memory to another memory region of the nonvolatile memory, the third write operations being different from the second write operations, and wait operations during which no data are written, read, or erased in the nonvolatile memory, such that:

during a first duration of time, a first ratio of (A) a time period spent for the first write operations to (B) a sum of time periods spent for the first and second write operations and the wait operations during a first sub duration of time during which no third write operations are carried out, becomes equal to a second ratio of (A) the time period spent for the first write operations to (C) a sum of time periods spent for the first, second, and third operations and the wait operations during a second sub duration of time during which the third write operations are carried out, during a second duration of time after the first duration of time, the first ratio becomes equal to the second ratio, and a third ratio of (D) a time period spent for the wait operations to (B) the sum of time periods spent for the first and second write operations and the wait operations during the first sub duration of time in the second duration of time, becomes less than a fourth ratio of (D) the time period spent for the wait operations to (B) the sum of time periods spent for the first and second write operations and the wait operations during the first sub duration of time in the first duration of time.

6. The method according to claim 5, further comprising: maintaining a table indicating correspondence between different durations of time and predefined ratios; and determining the time period spent for the wait operations during the first sub duration of time based on a corresponding one of the predefined ratios.

7. The method according to claim 5, wherein each of the second write operations includes a garbage collection, and each of the third write operations includes a refresh operation.

8. The method according to claim 5, wherein the nonvolatile memory is a nonvolatile semiconductor memory.

9. A storage device comprising:
a nonvolatile memory;
a communication interface connectable to an external device; and
a control circuit configured to carry out first write operations to write data received through the communication interface in the nonvolatile memory, second write operations to write data stored in a memory region of the nonvolatile memory to another memory region of the nonvolatile memory, third write operations to write data stored in a memory region of the nonvolatile memory to another memory region of the nonvolatile memory, the third write operations being different from the second write operations, and wait operations during which no data are written, read, or erased in the nonvolatile memory, such that:

during a first duration of time, a first ratio of (A) an amount of data written in the nonvolatile memory during the first write operations to (B) a sum of an amount of data written in the nonvolatile memory during the first and second write operations, and an amount of data writable in the nonvolatile memory while carrying out the wait operations during a first sub duration of time during which no third write operations are carried out, becomes equal to a second ratio of (A) the amount of data written in the nonvolatile memory during the first write operations to (C) a sum of an amount of data written in the nonvolatile memory during the first, second, and third write operations, and the amount of data writable in the nonvolatile memory while carrying out the wait operations during a second sub duration of time during which the third write operations are carried out, during a second duration of time after the first duration of time, the first ratio becomes equal to the second ratio, and a third ratio of (D) a time period spent for the wait operations to (E) the sum of time periods spent for the first and second write operations and the wait operations during the first sub duration of time in the second duration of time, becomes less than a fourth ratio of (D) the time period spent for the wait operations to (E) the sum of time periods spent for the first and second write operations and the wait operations during the first sub duration of time in the first duration of time.

10. The storage device according to claim 9, wherein the control circuit maintains a table indicating correspondence between different durations of time and predefined ratios, and determines the time period spent for the wait operations during the first sub duration of time based on a corresponding one of the predefined ratios.

11. The storage device according to claim 9, wherein each of the second write operations includes a garbage collection, and each of the third write operations includes a refresh operation.

12. The storage device according to claim 9, wherein the nonvolatile memory is a nonvolatile semiconductor memory.

* * * * *